United States Patent
Park (10) Patent No.: US 9,627,456 B2
(45) Date of Patent: Apr. 18, 2017

(54) ORGANIC LIGHT-EMITTING DISPLAY APPARATUS

(71) Applicant: SAMSUNG DISPLAY CO., LTD., Yongin-si, Gyeonggi-do (KR)

(72) Inventor: Seongsik Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/823,925

(22) Filed: Aug. 11, 2015

(65) Prior Publication Data

US 2016/0233274 A1 Aug. 11, 2016

(30) Foreign Application Priority Data

Feb. 5, 2015 (KR) .................. 10-2015-0018131

(51) Int. Cl.
- *H01L 27/32* (2006.01)
- *H01L 51/50* (2006.01)
- *H01L 51/52* (2006.01)

(52) U.S. Cl.
CPC ...... *H01L 27/3232* (2013.01); *H01L 51/5268* (2013.01); *H01L 51/5234* (2013.01); *H01L 51/5265* (2013.01); *H01L 2251/568* (2013.01)

(58) Field of Classification Search
CPC .............. H01L 27/3232; H01L 27/322; H01L 27/3248; H01L 27/3211; H01L 51/5084;

(Continued)

(56) References Cited

U.S. PATENT DOCUMENTS

| 8,519,622 B2 | 8/2013 | Iwase et al. |
| 2002/0113920 A1* | 8/2002 | Kubota ................. G02F 1/1334 349/86 |

(Continued)

FOREIGN PATENT DOCUMENTS

| JP | 11-237619 A | 8/1999 |
| KR | 10-2000-0066305 A | 11/2000 |

(Continued)

OTHER PUBLICATIONS

"Full-Color Organic EL Panels Based on Sony's Unique "Super Top Emission" Technology", 4 pages.

(Continued)

*Primary Examiner* — Christine Enad (74) *Attorney, Agent, or Firm* — Lewis Roca Rothgerber Christie LLP (57) ABSTRACT

An organic light-emitting display apparatus includes: a display substrate; at least one thin film transistor (TFT) on the display substrate; an organic light-emitting diode (OLED) electrically connected to the TFT, the OLED including: a first electrode on each sub-pixel on the display substrate; an intermediate layer on the first electrode; and a second electrode on the intermediate layer; an encapsulation substrate covering the OLED; a filler filling a space between the display substrate and the encapsulation substrate, the filler including scatterers having optical anisotropy; and a color filter between the encapsulation substrate and the filler, the color filter including a color filter electrode at a surface of the color filter.

20 Claims, 5 Drawing Sheets (58) Field of Classification Search
CPC ............ H01L 51/5253; H01L 51/5088; H01L 51/5056; H01L 51/5092
See application file for complete search history.

(56) References Cited

U.S. PATENT DOCUMENTS

| | | |
|---|---|---|
| 2005/0269952 A1 | 12/2005 | Kim |
| 2009/0015757 A1 | 1/2009 | Potts et al. |
| 2009/0195150 A1 | 8/2009 | Chen et al. |
| 2011/0143468 A1 | 6/2011 | Chen et al. |
| 2011/0194062 A1* | 8/2011 | Lee ................... G02F 1/1339 349/149 |
| 2012/0153293 A1* | 6/2012 | Koyama ............. G09G 3/3225 257/72 |
| 2012/0268699 A1* | 10/2012 | Min ................... G02F 1/13394 349/106 |
| 2013/0303677 A1* | 11/2013 | Kim ................... G02B 5/3016 524/508 |
| 2014/0022478 A1* | 1/2014 | Kim ................... G02F 1/1339 349/43 |

FOREIGN PATENT DOCUMENTS

| | | |
|---|---|---|
| KR | 10-2005-0115631 A | 12/2005 |
| KR | 10-2011-0042950 A | 4/2011 |

OTHER PUBLICATIONS

Kashiwabara, M. et al., "29.5L: Late-News Paper: Advanced AM-OLED Display Based on White Emitter with Microcavity Structure", SID 04 Digest, 2004, pp. 1017-1019.

* cited by examiner

ORGANIC LIGHT-EMITTING DISPLAY APPARATUS

CROSS-REFERENCE TO RELATED APPLICATION

This application claims priority to and the benefit of Korean Patent Application No. 10-2015-0018131, filed on Feb. 5, 2015, in the Korean Intellectual Property Office, the disclosure of which is incorporated herein in its entirety by reference.

BACKGROUND

1. Field

One or more exemplary embodiments relate to an organic light-emitting display apparatus.

2. Description of the Related Art

In general, an organic light-emitting display apparatus may be used as a display apparatus in mobile devices such as smart phones, tablet PCs, laptop computers, digital cameras, camcorders, and mobile information terminals, or electronic devices such as ultra-thin televisions, and advertisement panels.

The organic light-emitting display apparatus with increased color purity and color reproduction area may be desirable. In addition, when defects occur, a laser repair may be used for the organic light-emitting display apparatus.

SUMMARY

One or more exemplary embodiments relate to an organic light-emitting display apparatus.

Additional aspects will be set forth in part in the description which follows and, in part, will be apparent from the description, or may be learned by practice of the presented embodiments.

According to one or more exemplary embodiments, an organic light-emitting display apparatus includes: a display substrate; at least one thin film transistor (TFT) on the display substrate; an organic light-emitting diode (OLED) electrically connected to the TFT, the OLED including: a first electrode on each sub-pixel on the display substrate; an intermediate layer on the first electrode; and a second electrode on the intermediate layer; an encapsulation substrate covering the OLED; a filler filling a space between the display substrate and the encapsulation substrate, the filler including scatterers having optical anisotropy; and a color filter between the encapsulation substrate and the filler, the color filter including a color filter electrode at a surface of the color filter.

The scatterers may be arranged in the filler, and a plurality of liquid crystals may be in the scatterers.

The liquid crystals may be arranged at random.

A refractive index in a z axial direction of a liquid crystal director may be different from a refractive index of an xy plane at right angle to the liquid crystal director, and the refractive index of the xy plane may be the same as a refractive index of the filler.

The scatterers may have a spherical shape, an ellipsoidal shape, and/or a network shape.

The filler may include an ultraviolet curable polymer.

The filler may include acrylate-based pre-polymer, thiolene-based pre-polymer, and/or silicone-based pre-polymer.

The liquid crystals included in the scatterers may include cyanobiphenyl-based mixtures, phenylcyclohexane and/or biphenylcyclohexane mixtures, or cyclohexane-fluorinated biphenyls and/or fluorinated terphenyls mixtures.

The organic light-emitting display apparatus may be configured to operate in a non-scattering mode in which the liquid crystals may be arranged in a direction parallel to an electric field when voltages are applied to the color filter electrode and the second electrode.

The color filter electrode may be on the surface of the color filter facing the filler.

The color filter electrode may include a transparent electrode.

The color filter electrode may include a common electrode.

The intermediate layer may include: an emissive layer; and at least one pattern layer stacked on at least one surface of the emissive layer.

The at least one pattern layer may include at least one of a hole injection layer (HIL), a hole transport layer (HTL), an electron transport layer (ETL), or an electron injection layer (EIL).

The emissive layer and the pattern layer may be in an emissive area of each sub-pixel.

The emissive layer may be in an emissive area of each sub-pixel, and the pattern layer may extend over emissive areas of neighboring sub-pixels.

The second electrode may include: a common electrode on the intermediate layer in an emissive area of each sub-pixel; and a connection electrode configured to electrically connect the common electrodes to each other.

The connection electrode may integrally extend over emissive areas of neighboring sub-pixels.

The second electrode may include a transflective metal layer.

The second electrode may integrally extend over emissive areas of neighboring sub-pixels.

BRIEF DESCRIPTION OF THE DRAWINGS

The above and/or other aspects will become apparent and more readily appreciated from the following description of the exemplary embodiments, taken in conjunction with the accompanying drawings in which.

DETAILED DESCRIPTION

As the invention allows for various changes and numerous embodiments, particular embodiments will be illustrated in the drawings and described in detail in the written description. However, these embodiments not intended to limit the present invention, and it is to be appreciated that all changes, equivalents, and substitutes that do not depart from the spirit and scope of the present invention are encompassed in the present invention. In the description of the present invention, certain detailed explanations of the related art are omitted when it is deemed that they may unnecessarily obscure the essence of the invention.

While such terms as "first", "second", etc., may be used to describe various components, such components are not to be limited to the above terms. The above terms are used only to distinguish one component from another. Thus, a first element, component, region, layer or section described below could be termed a second element, component, region, layer or section, without departing from the spirit and scope of the present invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

One or more embodiments of the present invention relating to an organic light-emitting display apparatus and a method of manufacturing the same will be described with reference to the accompanying drawings. Like reference numerals in the drawings denote like elements, and thus, their description may be omitted.

Figure 1:
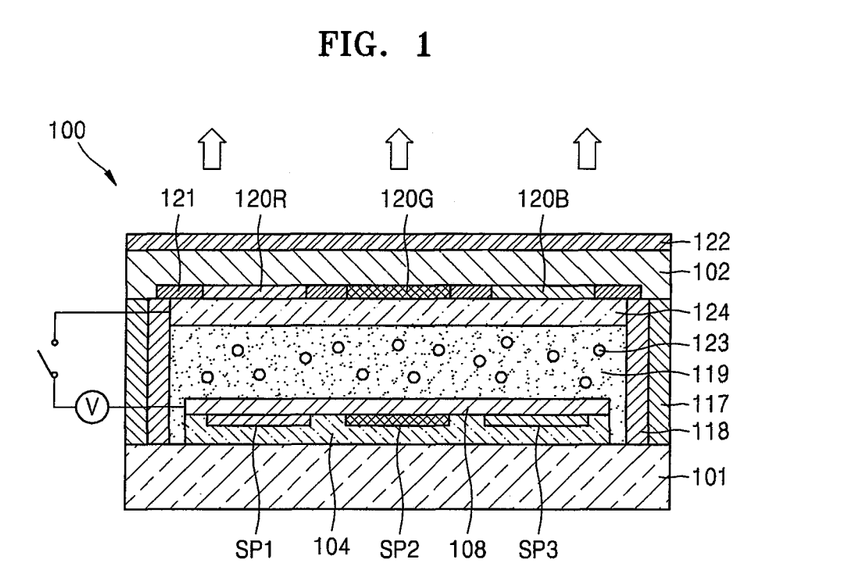
FIG. 1 is a cross-sectional view of an organic light-emitting display apparatus, according to an exemplary embodiment.

FIG. 1 is a cross-sectional view of an organic light-emitting display apparatus 100, according to an exemplary embodiment.

Referring to FIG. 1, the organic light-emitting display apparatus 100 includes a display substrate 101 including a thin film transistor (103 of FIG. 3), and an encapsulation substrate 102 facing the display substrate 101.

A plurality of sub-pixels SP1, SP2, and SP3 may be disposed on the display substrate 101 with an insulating layer 104 therebetween. The plurality of sub-pixels SP1, SP2, and SP3 may emit light of different colors. For example, the plurality of sub-pixels SP1, SP2, and SP3 may respectively display blue, green, and red colors.

In the present embodiment, it is described that the first sub-pixel SP1 displays the red color, the second sub-pixel SP2 displays the green color, and the third sub-pixel SP3 displays the blue color, but the present invention is not limited thereto. As long as a full color image may be displayed, a combination of different colors other than a combination of the red, green, and blue colors may be possible.

In an exemplary embodiment, as long as a structure may display the full color image, other than a combination of the sub-pixels SP1, SP2, and SP3, various modifications including a combination of red, green, blue, and white colors may be possible.

A stack structure including an intermediate layer (107 of FIG. 3) that will be described later may be arranged in each of the sub-pixels SP1, SP2, and SP3. A second electrode (108 of FIG. 3) may be formed on each of the sub-pixels SP1, SP2, and SP3 as a common electrode.

Figure 3:
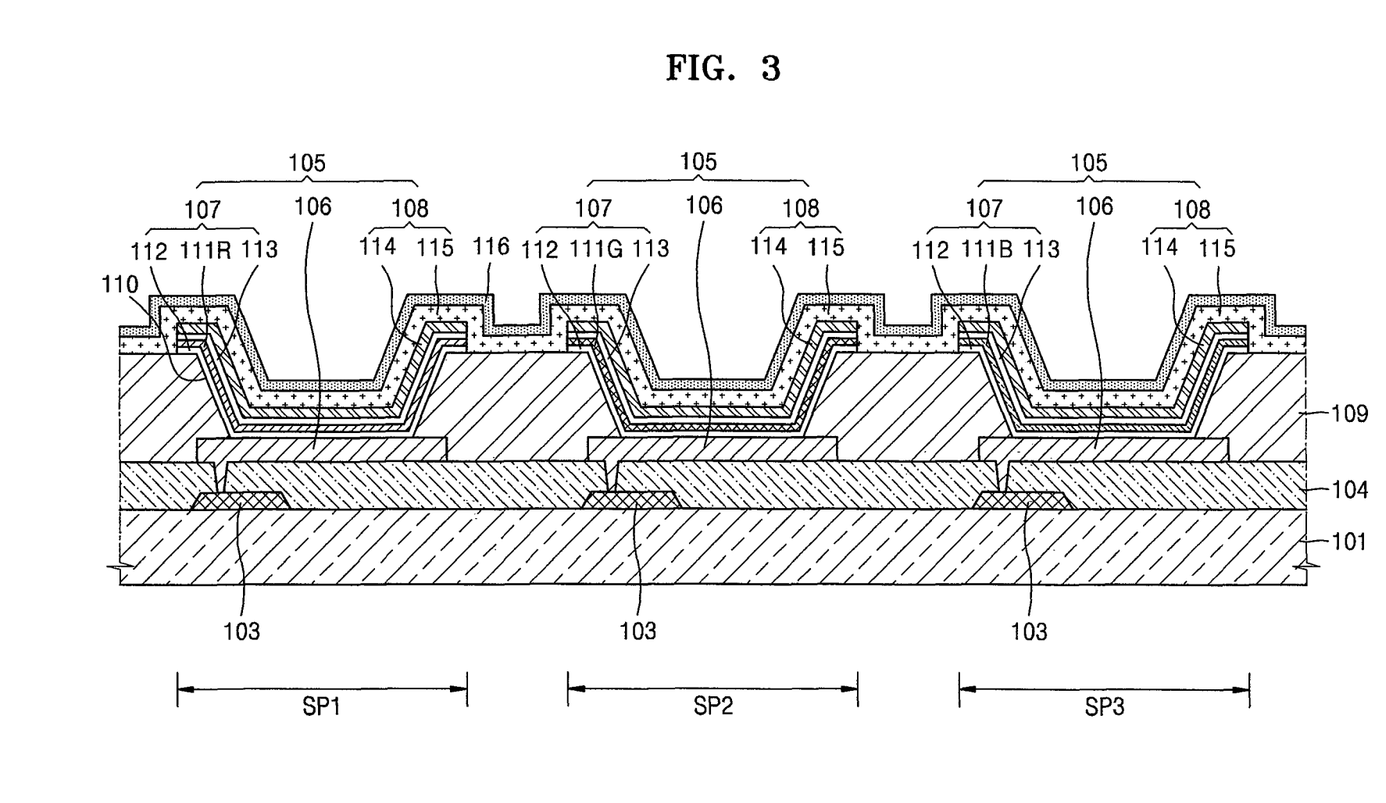
FIG. 3 is a cross-sectional view of a portion of a display apparatus of FIG. 1.

In more detail, referring to FIG. 3, the display substrate 101 may be formed of an insulating material having flexibility or an insulating material having rigidity. For example, the display substrate 101 may be a flexible film, a glass substrate having rigidity, a metal substrate, or any combination thereof. The display substrate 101 may be transparent, translucent, or opaque.

A barrier layer that may be formed of silicon oxide (SiOx), silicon nitride (SiNx), etc. may be provided on the display substrate 101 to prevent or substantially prevent impurities from penetrating into the display substrate 101.

A thin film transistor 103 may be formed on the display substrate 101. An insulating layer 104 may be formed on the thin film transistor (TFT) 103.

An organic light-emitting diode (OLED) 105 may be formed in each of the sub-pixels SP1, SP2, and SP3. The OLED 105 may be electrically connected to the TFT 103. The OLED 105 includes a first electrode 106 formed in each of the sub-pixels SP1, SP2, and SP3, an intermediate layer 107 formed on the first electrode 106, and the second electrode 108 formed on the intermediate layer 107.

The first electrode 106 may be an island type and may be patterned on a location corresponding to each of the sub-pixels SP1, SP2, and SP3. The first electrode 106 may function as an anode, and may be formed of various conductive materials. According to an exemplary embodiment, the first electrode 106 may be formed as a reflective electrode. The first electrode 106 may be formed as a single reflective metal layer formed of any one of Ag, Al, Au, Pt, Cr, Mg, Pd, Ni, Nd, Cr, and an alloy including these. According to an exemplary embodiment, the first electrode 106 may further include a transparent conductive film formed of indium tin oxide (ITO), indium zinc oxide (IZO), zinc oxide (ZnO), indium oxide ($In_2O_3$), etc., on an upper portion of the single reflective metal layer.

A pixel-defining layer 109 has an opening 110 corresponding to each of the sub-pixels SP1, SP2, and SP3. An upper portion of the first electrode 106 may be exposed through the opening 110 of the pixel-defining layer 109. An edge of the first electrode 106 may be surrounded by the pixel-defining layer 109. The pixel-defining layer 109 defines an emission area of each of the sub-pixels SP1, SP2, and SP3 by surrounding the edge of the first electrode 106.

The pixel-defining layer 109 may be an organic or inorganic layer. For example, the pixel-defining layer 109 may be formed of organic materials such as polyimide, polyamide, benzocyclobutene (BCB), acrylic resin, phenol resin, and/or the like, or inorganic materials such as SiNx.

The pixel-defining layer 109 may be a single layer or multiple layers.

The intermediate layer 107 may be formed on an area of the first electrode 106 in which a portion of the pixel-defining layer 109 is exposed. According to an exemplary embodiment, the intermediate layer 107 may be formed through a deposition process.

The intermediate layer 107 may have a structure in which a plurality of layers are stacked.

The intermediate layer 107 may include emissive layers 111R, 111G, and 111B, and one or more pattern layers 112 and 113 formed on one or more surfaces of the emissive layers 111R, 111G, and 111B. The intermediate layer 107 may be patterned in an island type in each of the sub-pixels SP1, SP2, and SP3. Alternatively, the pattern layers 112 and 113 may integrally extend over the neighboring sub-pixels SP1, SP2, and SP3.

The intermediate layer 107 includes the emissive layers 111R, 111G, and 111B, and may further include at least one of a hole injection layer (HIL), a hole transport layer (HTL), an electron transport layer (ETL), and an electron injection layer (EIL). According to an exemplary embodiment, the intermediate layer 107 may include the emissive layers 111R, 111G, and 111B and may further include various functional layers such as a scattering layer, but is not limited thereto.

In the present embodiment, a first pattern layer 112 may be formed between the first electrode 106 and the emissive layers 111R, 111G, and 111B. The first pattern layer 112 may include an HIL and an HTL. A second pattern layer 113 may be formed between the emissive layers 111R, 111G, and 111B and the second electrode 108. The second pattern layer 113 may include an ETL and an EIL.

Holes and electrons respectively injected from the first electrode 106 and the second electrode 108 may be combined in the emissive layers 111R, 111G, and 111B, and the emissive layers 111R, 111G, and 111B may emit light of desired colors.

The emissive layer 111R of the first sub-pixel SP1 may display a red color, and may be patterned in an island type in a location corresponding to the first sub-pixel SP1. The emissive layer 111G of the second sub-pixel SP2 may display a green color, and may be patterned in an island type in a location corresponding to the second sub-pixel SP2. The emissive layer 111B of the third sub-pixel SP3 may display a blue color, and may be patterned in an island type in a location corresponding to the third sub-pixel SP3.

The second electrode 108 may be formed on the intermediate layer 107.

The second electrode 108 may function as a cathode. The second electrode 108 includes a common electrode 114 formed on the intermediate layer 107 in an emissive area of each of the sub-pixels SP1, SP2, and SP3. The second electrode 108 further includes a connection electrode 115 formed on the common electrode 114 for each of the sub-pixels SP1, SP2, and SP3, and the connection electrode 115 electrically connects a plurality of common electrodes 114 to each other.

In more detail, the common electrode 114 may have both translucency and reflectivity. The common electrode 114 may be patterned in an island type in a location corresponding to each of the sub-pixels SP1, SP2, and SP3. According to an exemplary embodiment, the common electrode 114 may include a transflective metal layer. The common electrode 114 may partially transmit or reflect light emitted from the emissive layers 111R, 111G, and 111B by properly adjusting a thickness of the transflective metal layer. According to an embodiment, a microcavity structure is formed between the first electrode 106 and the common electrode 114, or between the common electrode 114 and the connection electrode 115, thereby improving light efficiency of the organic light-emitting display apparatus 100.

According to an embodiment, the common electrode 114 may include silver (Ag) and magnesium (Mg). For example, the common electrode 114 may be formed of a silver (Ag)-magnesium (Mg) alloy. According to another embodiment, the common electrode 114 may include any one selected from among magnesium (Mg), silver (Ag), lithium (Li), sodium (Na), calcium (Ca), and strontium (Sr), and/or an alloy of these.

The connection electrodes 115 may be integrally formed to cover all of the sub-pixels SP1, SP2, and SP3. The connection electrode 115 may extend over the emission area of each of the sub-pixels SP1, SP2, and SP3 and the pixel defining layer 109 that is between neighboring sub-pixels SP1, SP2, and SP3. The connection electrodes 115 may electrically connect the plurality of common electrodes 114 patterned in an island type in the location corresponding of each of the sub-pixels SP1, SP2, and SP3.

The connection electrode 115 may cover a display area. The term "display area" as used here may refer to all areas in which light of the organic light-emitting display apparatus 100 may be emitted. For example, the display area may refer to all areas except for an edge of the organic light-emitting display apparatus 100 in which a controller, etc. is positioned. When no dead area is present in an entire surface of the organic light-emitting display apparatus 100, the entire surface of the organic light-emitting display apparatus 100 may be the display area.

The connection electrode 115 may have both translucency and reflectivity. For example, the connection electrode 115 may include a transflective metal layer. The connection electrode 115 may partially transmit or reflect the light emitted from the emissive layers 111R, 111G, and 111B by properly adjusting a thickness of the transflective metal layer.

According to an embodiment, the connection electrode 115 may include silver (Ag) and magnesium (Mg). According to another embodiment, the connection electrode 115 may include any one selected from magnesium (Mg), silver (Ag), lithium (Li), sodium (Na), calcium (Ca), and strontium (Sr), and/or an alloy of these.

Although not shown, a conductive protection film may be further formed between the common electrode 114 and the connection electrode 115. The conductive protection film may electrically connect the common electrode 114 to the connection electrode 115. The conductive protection film may have translucency in such a way that the light emitted from the emissive layers 111R, 111G, and 111B may be emitted to the outside. The conductive protection film may include an oxide such as ITO, IZO, WOx, MoOx, and InOx, or a conductive polymer such as PEDOT, and may be formed as a single layer or a plurality of layers.

As described above, the intermediate layer 107 and the common electrode 114 are patterned in an island type in the location corresponding to each of the sub-pixels SP1, SP2, and SP3, whereas the connection electrodes 115 are integrally formed in the sub-pixels SP1, SP2, and SP3, and thus, an upper surface of the pixel defining layer 109 disposed between the neighboring sub-pixels SP1, SP2, and SP3 may contact the connection electrode 115.

At least one of the sub-pixels SP1, SP2, and SP3 may include an optical resonance structure, e.g., a microcavity. The optical resonance structure is included, thereby increasing color purity and a color reproduction area.

A capping layer 116 may be formed on the connection electrode 115 to protect the OLED 105.

The organic light-emitting display apparatus 100 may be a top-emission type display apparatus in which light generated from the emissive layers 111R, 111G, and 111B is emitted toward the encapsulation substrate (102 of FIG. 1) in the present embodiment. However, the present invention is not limited thereto, and in some embodiments, the organic light-emitting display apparatus 100 may be a bottom-emission type display apparatus in which the light generated from the emissive layers 111R, 111G, and 111B is emitted toward the display substrate 101 on which the TFT 103 is formed.

The TFT 103 may be a top gate transistor in which a gate electrode is positioned above a semiconductor active layer in the present embodiment. However, the present invention is not limited thereto, and in some embodiments, the TFT 103 may be a TFT having a different structure, such as a bottom gate transistor in which the gate electrode is positioned below the semiconductor active layer.

Referring to FIG. 1, the encapsulation substrate 102 may be formed on the second electrode 108. The encapsulation substrate 102 may be formed to protect the OLED (105 of FIG. 3) from external moisture or oxygen, etc. The encapsulation substrate 102 may be formed of glass having rigidity, polymer resin, or a flexible film. According to an embodiment, the encapsulation substrate 102 may be formed by alternately stacking organic layers and inorganic layers on the OLED 105.

A sealing portion 117 may be formed on a surface in which the display substrate 101 and the encapsulation substrate 102 face each other. The sealing portion 117 may be formed along edges of the display substrate 101 and the encapsulation substrate 102 (e.g., between the display substrate 101 and the encapsulation substrate 102).

The sealing portion 117 may be formed of a suitable material that is melted by a laser. For example, the sealing portion 117 may include glass frit. According to an embodiment, as long as the material is melted and cured by applying heat energy thereto, the sealing portion 117 may include any suitable material.

A getter 118 may be formed in an inner side (e.g., an inner surface) of the sealing portion 117. The getter 118 may prevent or substantially prevent the organic light-emitting display apparatus 100 from deteriorating due to penetration of moisture. The getter 118 may use a liquid or paste material. The getter 118 may include a material for absorbing oxygen or moisture in the air, for example, calcium oxide (CaO) in the form of powder or selenium oxide (SeO), or a mixture of metal-based oxide and acryl-based resin. The getter 118 may be coated by using the liquid material or sprayed by adjusting viscosity thereof, but is not limited thereto. In the present embodiment, the getter 118 has a structure in which the getter 118 is positioned on the inside of the sealing portion 117, but a position of the getter 118 is not limited thereto.

Although not shown, a reinforcing member may be further formed on the outside of the sealing portion 117. The reinforcing member may supplement cohesion strength of the sealing portion 117, and may be formed of a material having an adhesive force. For example, the reinforcing member may be formed of an organic sealant, such as urethane-based resin, epoxy-based resin, and/or acryl-based resin, or an inorganic sealant, such as silicon.

A functional film 122 having various functions may be formed on the encapsulation substrate 102. For example, the functional film 122 may include at least one of a touch screen, a polarizing plate, a cover window, and a reflection prevention film, such as an antireflective film or a low reflective film. When the functional film 122 includes a touch screen, the touch screen may include an on-cell touch screen panel in which a touch screen pattern is directly formed on the encapsulation substrate 102.

A filler 119 may be formed between the display substrate 101, the encapsulation substrate 102, and the sealing portions 117. The filler 119 fills a space located between the display substrate 101, the encapsulation substrate 102, and the sealing portions 117. In the present embodiment, the filler 119 completely fills the space located between the display substrate 101, the encapsulation substrate 102, and the sealing portions 117.

Color filters 120R, 120G, and 120B may be formed between the encapsulation substrate 102 and the filler 119. The color filters 120R, 120G, and 120B may be formed in a location corresponding to the sub-pixels SP1, SP2, and SP3, respectively.

For example, a red color filter 120R may be formed in the location corresponding to the first sub-pixel SP1, a green color filter 120G may be formed in the location corresponding to the second sub-pixel SP2, and a blue color filter 120B may be formed in the location corresponding to the third sub-pixel SP3. The color filters 120R, 120G, and 120B may be used to block light emitted with colors other than corresponding colors emitted from the emissive layers (111R, 111G, and 111B of FIG. 2).

A black matrix 121 may be formed between neighboring color filters 120R, 120G, and 120B. The black matrix 121 is formed in a location corresponding to a non-emissive area of each of the sub-pixels SP1, SP2, and SP3. The black matrix 121 may absorb reflected external light to improve contrast. The black matrix 121 may include a reflective light absorption film, for example, a black resin film or a thin film filter in which chrome (Cr) and oxide chrome ($Cr_2O_3$) are alternately stacked.

As described above, the organic light-emitting display apparatus 100 may employ a resonance structure to reduce reflection of external light of a color corresponding to each of the sub-pixels SP1, SP2, and SP3, and may use the color filters 120R, 120G, and 120B to block light generated with a color other than the corresponding colors, thereby maintaining a maximum or improved emission efficiency and effectively blocking external light. Thus, an expensive circular polarizing plate film for blocking the reflection of external light may not be used to improve contrast ratio.

The resonance structure may increase color purity and a color reproduction area, whereas an emission spectrum may vary according to an increase in a viewing angle owing to the resonance structure. Thus, a color displayed in the front of the organic light-emitting display apparatus 100 may vary.

To improve this, a plurality of scatterers 123 may be formed in the filler 119. The scatterers 123 may be distributed in the filler 119. If light scattering of the distributed scatterers 123 is used to change a traveling direction of the light, the emission spectrum of each angle of the light may be mixed, thereby reducing a difference in the emission spectrum of each angle of the light.

Meanwhile, a defect that occurs during manufacturing of the organic light-emitting display apparatus 100 may be repaired by irradiating laser. The defect may include a short circuit defect that short-circuits different signal lines of the organic light-emitting display apparatus 100, e.g., gate lines or data lines, or a foreign defect including a dark spot between patterned thin films of the organic light-emitting display apparatus 100. The laser used for repairing may include gas laser, solid laser, or semiconductor laser.

The scatterers 123 may improve a color change according to the increase in the viewing angle. However, the sub-pixels SP1, SP2, and SP3, the TFT (103 of FIG. 3), and wirings may not be well seen due to a high haze characteristic of the filler 119 including the scatterers 123, and thus, it may not be easy to find the defect that may occur during the manufacturing of the organic light-emitting display apparatus 100. In addition, a laser beam irradiated from a laser device may be scattered by the scatterers 123, and thus, the defect may not be repaired.

The scatterers 123 may have an optical anisotropy to facilitate repair of the defect.

In more detail, a color filter electrode 124 may be formed on one surface of the color filters 120R, 120G, and 120B. The color filter electrode 124 may be a transparent electrode, for example, a transparent conductive film such as ITO, IZO, ZnO, $In_2O_3$, etc. The color filter electrode 124 may be formed on a surface of the color filters 120R, 120G, and 120B facing the filler 119. The color filter electrode 124 may be formed as a common electrode over an entire area (e.g., surface area) of the color filters 120R, 120G, and 120B.

Figure 2:
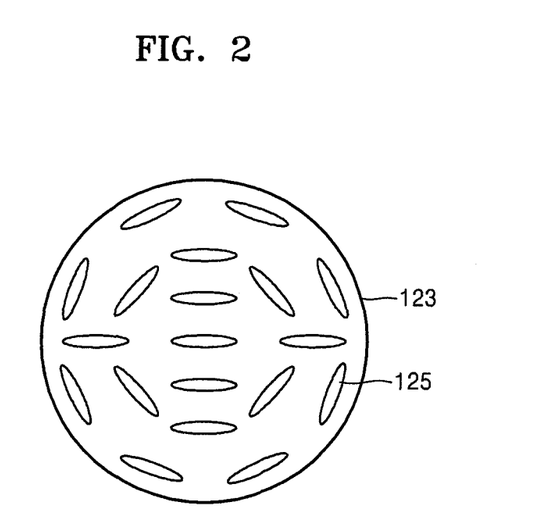
FIG. 2 is an enlarged diagram of a scatterer of FIG. 1.

The scatterers 123 include a plurality of liquid crystals 125, as shown in FIG. 2. In more detail, the plurality of scatterers 123 are distributed in the filler 119. The scatterers 123 may include the plurality of liquid crystals 125 arranged therein. In the present embodiment, the scatterers 123 have a spherical shape, but are not limited thereto. For example, the scatterers 123 may have an ellipsoidal shape or a network shape (523 of FIG. 5). The spherical scatterers 123 may be formed by distributing the plurality of liquid crystals 125 in the filler 119 and curing the filler 119, when the filler 119 and the liquid crystals 125 are phase separated. The liquid crystals 125 of the spherical scatterers 123 may be arranged at random.

In the liquid crystals 125, a refractive index in a direction (e.g., in a z axial direction) of a liquid crystal director is different from a refractive index of a plane (e.g., an xy plane) at a right angle to the liquid crystal director ($n_z \neq n_x = n_y$). In this regard, when the refractive index of the z axial direction is a first refractive index ($n_z = n_1$) and the refractive index of the xy plane is a second refractive index ($n_x = n_y = n_2$), the filler 119 and the liquid crystals 125 may be selected such that a value of the second refractive index ($n_2$) may be the same as a refractive index of the filler 119.

The filler 119 may be configured as ultraviolet curable polymer.

For example, the filler 119 may be one selected from the group of acrylate-based pre-polymer, thiol-ene-based pre-polymer, and silicone-based pre-polymer.

The acrylate-based pre-polymer may include PN393 of Merck including Ebecryl 1810, 2-ethyl hexyl acrylate (EHA), tri-methylolpropane tri-acrylate (TMPTA), 2,4,6-trimethylbenzoyl-diphenyl-phosphine oxide, and 2-hydroxy-2-methylpropiophenone (Darocur4265), or urethane diacrylate (40 wt %) including 2-hydroxyethylmethacrylate (30 wt %), 1,1,1-trimethylolpropane triacrylate (30 wt %), and 2-hydroxy-2-methyl-phenypropane-1-one (2 wt %).

The thiol-ene-based pre-polymer may include NOA-65 of Norland including trimethylolpropane diallyl ether, trimethylolpropane trithiol, isophorone diisocyanate ester, and benzophenone.

The liquid crystals 125 included in the scatterers 123 may include cyanobiphenyl-based mixtures, phenylcyclohexane and/or biphenylcyclohexane mixtures, or cyclohexane-fluorinated biphenyls and/or fluorinated terphenyls mixtures.

The cyanobiphenyl-based mixtures may include one selected from the group among p-n-pentyl cyanobiphenyl (E7, Merck: 47% 5CB), heptylcyanobiphenyl (25% 7CB), p-n-octyloxy-p'-cyanobiphenyl (18% 8OCB), and 4-pentyl-4' cyanoterphenyl (10% T15).

Figure 4A:
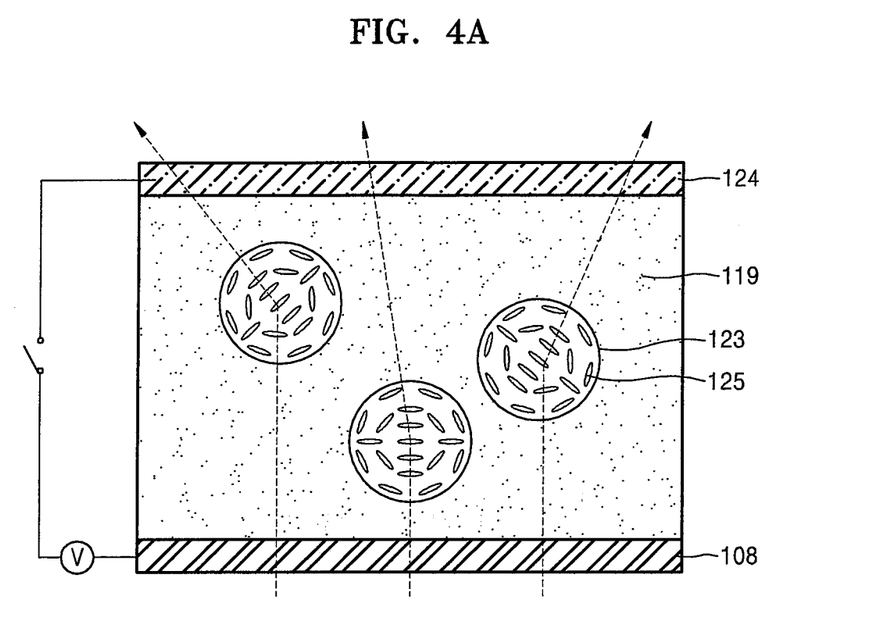
FIG. 4A is a diagram of a second electrode and a color filter electrode of FIG. 1 before voltages are applied thereto.
Figure 4B:
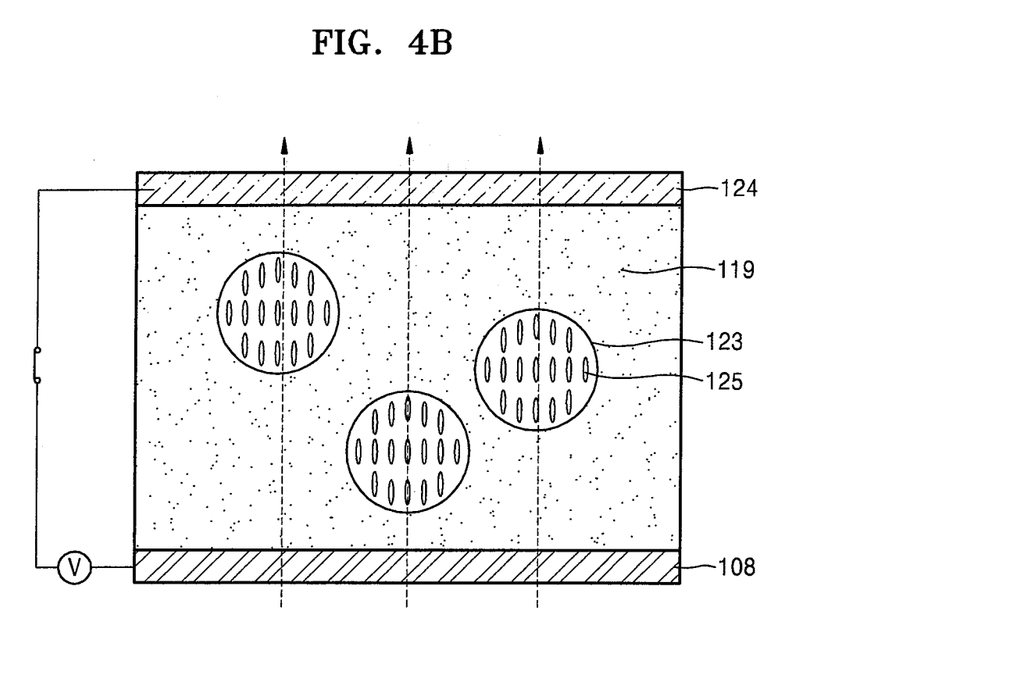
FIG. 4B is a diagram of a second electrode and a color filter electrode of FIG. 4A after voltages are applied thereto.

FIG. 4A is a diagram of the second electrode 108 and the color filter electrode 124 of FIG. 1 before voltages are applied thereto. FIG. 4B is a diagram of the second electrode 108 and the color filter electrode 124 of FIG. 4A after voltages are applied thereto.

Referring to FIG. 4A, when a driving voltage is not applied to the second electrode 108 and the color filter electrode 124, the liquid crystals 125 that are phase separated in a spherical shape may have no uniform orientation directions of molecules, and may be arranged at random. Incident light may be scattered due to a difference in a refractive index of the filler 119 and a refractive index of the liquid crystals 125 as indicated by arrows.

Referring to FIG. 4B, when the driving voltage is applied to the second electrode 108 and the color filter electrode 124, the liquid crystals 125 that are phase separated in the spherical shape may be oriented in a direction parallel to an electric field. Accordingly, the refractive index of the filler 119 and the refractive index of the liquid crystals 125 are identical or substantially identical as indicated by the arrows, and thus, the organic light-emitting display apparatus (100 of FIG. 1) is in a non-scattering mode in which the incident light is not scattered.

As described above, when the liquid crystals 125 are arranged by applying driving voltages to the second electrode 108 and the color filter electrode 124, a defect inspection and a laser repair may be possible.

Figure 5:
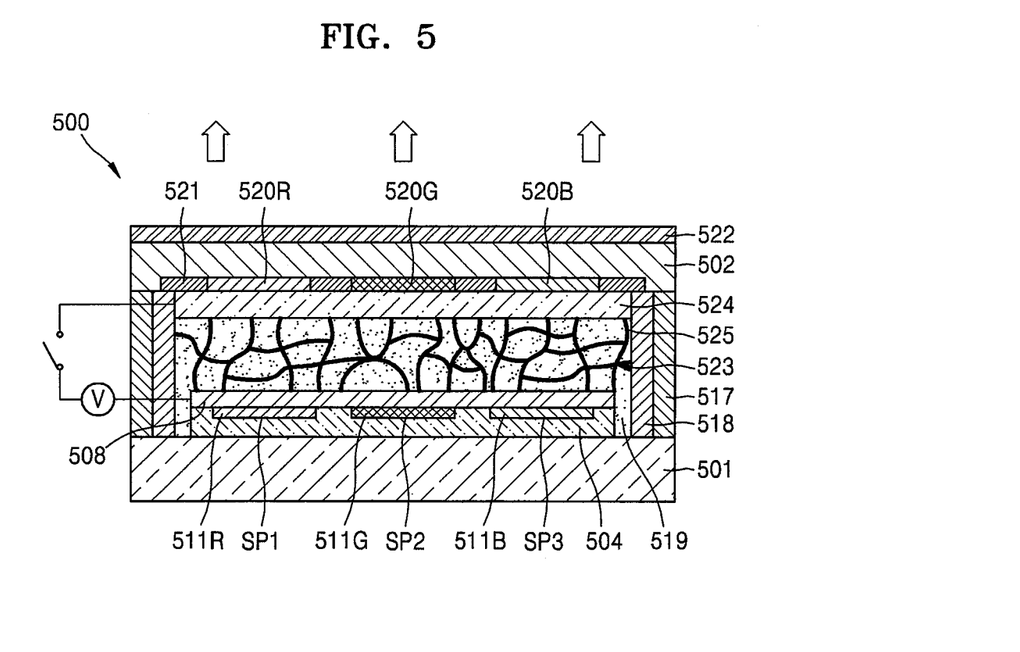
FIG. 5 is a cross-sectional view of an organic light-emitting display apparatus, according to another exemplary embodiment.

FIG. 5 is a cross-sectional view of an organic light-emitting display apparatus 500, according to another exemplary embodiment.

The embodiment of FIG. 5 is substantially the same as the embodiment of FIG. 1, except for a structure of a liquid crystal.

Referring to FIG. 5, the organic light-emitting display apparatus 500 includes a display substrate 501, which includes a thin film transistor, and an encapsulation substrate 502 facing the display substrate 501.

The plurality of sub-pixels SP1, SP2, and SP3 may be disposed on the display substrate 501 with an insulating layer 504 therebetween. In the present embodiment, a red emissive layer 511R, a green emissive layer 511G, and a blue emissive layer 511B may be respectively formed in the sub-pixels SP1, SP2, and SP3. A common electrode 508 of an OLED may be formed on the sub-pixels SP1, SP2, and SP3.

A sealing portion 517 may be disposed between the display substrate 501 and the encapsulation substrate 502. The sealing portion 517 may be formed along edges of the display substrate 501 and the encapsulation substrate 502. A getter 518 may be formed on the inside of the sealing portion 517.

A functional film 522 having various functions may be formed on the encapsulation substrate 502. For example, the functional film 522 may include at least one of a touch screen, a reflection prevention film, such as an antireflective film or a low reflective film, a polarizing plate, and a cover window.

A filler 519 may be formed between the display substrate 501, the encapsulation substrate 502, and the sealing portions 517. The filler 519 may fill a space located between the display substrate 501, the encapsulation substrate 502, and the sealing portions 517.

Color filters 520R, 520G, and 520B may be formed between the encapsulation substrate 502 and the filler 519. The color filters 520R, 520G, and 520B may be formed in locations corresponding to the sub-pixels SP1, SP2, and SP3. For example, a red color filter 520R may be formed in the location corresponding to the first sub-pixel SP1, a green color filter 520G may be formed in the location corresponding to the second sub-pixel SP2, and a blue color filter 520B may be formed in the location corresponding to the third sub-pixel SP3.

A black matrix 521 may be formed between neighboring color filters 520R, 520G, and 520B. The black matrix 521 is formed in a location corresponding to a non-emissive area of each of the sub-pixels SP1, SP2, and SP3.

A color filter electrode 524 may be formed on surfaces of the color filters 520R, 520G, and 520B. The color filter electrode 524 may be formed on the surfaces of the color filters 520R, 520G, and 520B facing the filler 519. The color filter electrode 524 may be formed as a common electrode.

Scatterers 523 including a plurality of liquid crystals 525 may be formed in the filler 519. The scatterers 523 may include the plurality of liquid crystals 525. Unlike the embodiment of FIG. 1, the liquid crystals 525 of the present embodiment may have a network shape. A phase separated shape of the liquid crystals 525 may be a spherical shape, an ellipsoidal shape, or the network shape by adjusting a composition ratio of the filler 519 and the liquid crystals 525.

When a driving voltage is applied to the common electrode 508 and the color filter electrode 524, the liquid crystals 525 that are phase separated in the network shape may be oriented in a direction parallel to an electric field. Accordingly, a refractive index of the filler 519 and a refractive index of the liquid crystals 525 are identical or substantially identical, and thus, the organic light-emitting display apparatus 500 is operating in a non-scattering mode in which incident light is not scattered. As described above, when the liquid crystals 525 are arranged by applying driving voltages to the common electrode 508 and the color filter electrode 524, a defect inspection and a laser repair may be possible.

Figure 6:
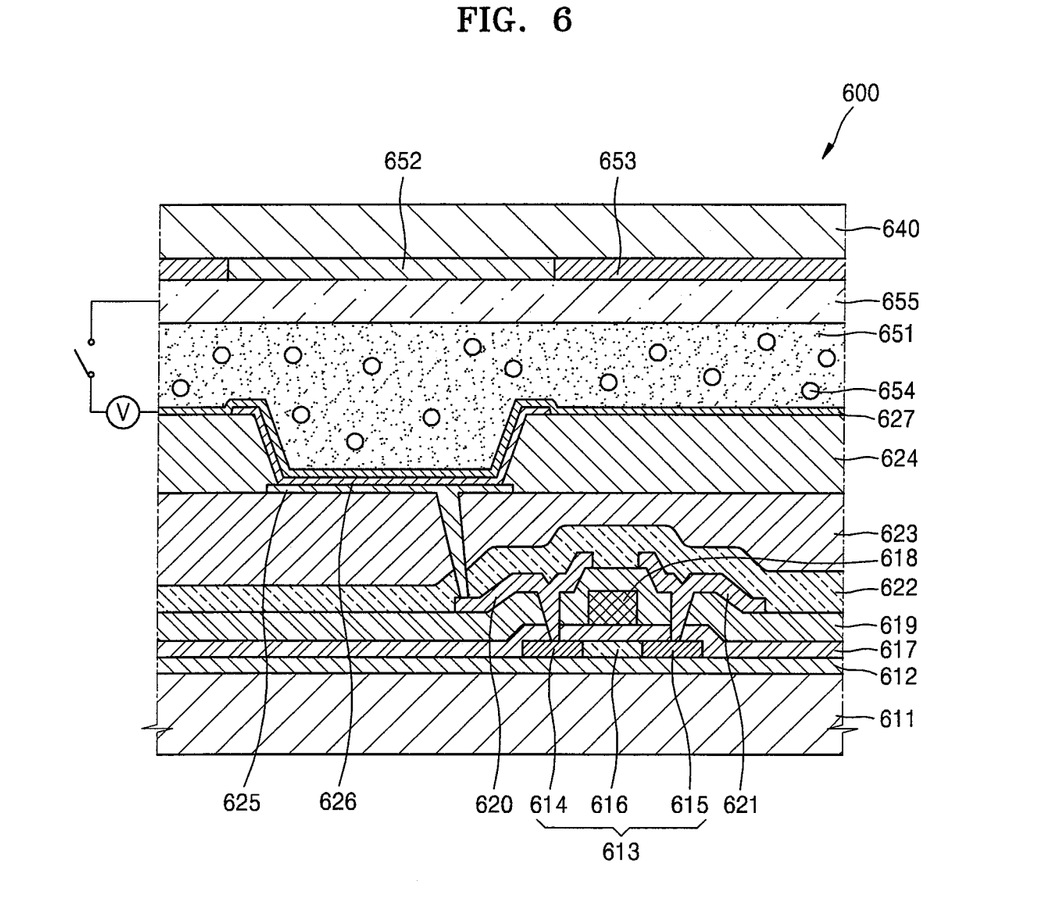
FIG. 6 is a cross-sectional view of a sub-pixel of an organic light-emitting display apparatus, according to another exemplary embodiment.

FIG. 6 is a cross-sectional view of a sub-pixel of an organic light-emitting display apparatus 600, according to another exemplary embodiment.

The embodiment of FIG. 6 is substantially the same as the embodiment of FIG. 1, except for a resonance structure.

Referring to FIG. 6, the organic light-emitting display apparatus 600 includes a display substrate 611 and an encapsulation substrate 640 facing the display substrate 611.

The display substrate 611 may be formed of an insulating material having flexibility or an insulating material. The display substrate 611 may be transparent, translucent, or opaque.

A barrier layer 612 may be formed on the display substrate 611. The barrier layer 612 may entirely cover a surface of the display substrate 611.

The barrier layer 612 may be formed of one of inorganic materials, such as silicon oxide (SiOx), silicon nitride (SiNx), silicon oxynitride (SiOxNy), aluminum oxide (AlOx), and aluminum nitride (AlOxNy), and organic materials, such as acryl, polyimide, and polyester.

The barrier layer 612 may be a single layer or multiple layers. The barrier layer 612 prevents or substantially prevents penetration of oxygen and moisture, and flattens (e.g., planarizes) the upper surface of the display substrate 611.

A TFT may be formed on the barrier layer 612. In the present embodiment, the TFT is a top gate transistor, but may be another type of transistor, for example, a bottom gate transistor.

A semiconductor active layer 613 may be formed on the barrier layer 612. The semiconductor active layer 613 includes a source area 614 and a drain area 615 doped with N-type impurity ions or P-type impurity ions. A channel area 616, which is not doped with impurities, is formed between the source area 614 and the drain area 615.

The semiconductor active layer 613 may be formed of an inorganic semiconductor, such as polysilicon, an organic semiconductor, or amorphous silicon.

According to an embodiment, the semiconductor active layer 613 may be formed of an oxide semiconductor. For example, the oxide semiconductor may include an oxide of a metal selected from Groups 4, 12, 13, and 14, such as zinc (Zn), indium (In), gallium (Ga), tin (Sn), cadmium (Cd), germanium (Ge), and hafnium (Hf), or a combination thereof.

A gate insulating layer 617 may be deposited on the semiconductor active layer 613. The gate insulating layer 617 may be an inorganic layer formed of SiOx, SiNx, or a metal oxide. The gate insulating layer 617 may be a single layer or multiple layers.

A gate electrode 618 may be formed on the gate insulating layer 617. The gate electrode 618 may include a single layer or multiple layers formed of Au, Ag, Cu, Ni, Pt, Pd, Al, Mo, Cr, or the like. The gate electrode 618 may include an alloy such as Al:Nd or Mo:W.

An interlayer insulating layer 619 may be formed on the gate electrode 618. The interlayer insulating layer 619 may be an inorganic material, such as SiOx, SiNx, or the like.

According to an embodiment, the interlayer insulating layer 619 may include an organic material.

A source electrode 620 and a drain electrode 621 may be formed on the interlayer insulating layer 619. In more detail, contact holes may be formed in the gate insulating layer 617 and the interlayer insulating layer 619 by selectively removing portions of the gate insulating layer 617 and the interlayer insulating layer 619. Through the contact holes, the source electrode 620 may be electrically connected to the source area 614, and the drain electrode 621 may be electrically connected to the drain area 615.

A passivation layer 622 may be formed on the source electrode 620 and the drain electrode 621. The passivation layer 622 may be formed of an inorganic material, such as silicon oxide, silicon nitride, or an organic material.

A planarization layer 623 may be formed on the passivation layer 622. The planarization layer 623 includes an organic material, such as acryl, polyimide, benzocyclobutene (BCB), etc.

One of the passivation layer 622 and the planarization layer 623 may be omitted.

The TFT may be electrically connected to the OLED.

The OLED may be formed on the planarization layer 623. The OLED includes a first electrode 625, an intermediate layer 626, and a second electrode 627.

The first electrode 625 may function as an anode and may be formed of various conductive materials. The first electrode 625 includes a transparent electrode or a reflective electrode. For example, when the first electrode 625 is used as a transparent electrode, the first electrode 625 includes a transparent conductive layer formed of indium tin oxide (ITO), indium zinc oxide (IZO), zinc oxide (ZnO), indium oxide ($In_2O_3$), or the like. When the first electrode 625 is used as a reflective electrode, the first electrode 625 may be formed as a reflective layer by using Ag, Mg, Al, Pt, Pd, Au, Ni, Nd, Ir, Cr, or a combination thereof, and in this case, a transparent conductive layer formed of ITO, IZO, ZnO, $In_2O_3$, or the like may be formed on an upper surface of the reflective layer.

A pixel-defining layer 624 may be formed on the planarization layer 623. The pixel-defining layer 624 may cover a portion of the first electrode 625. The pixel-defining layer 624 may define an emissive area of each sub-pixel by surrounding edges of the first electrode 625 of each sub-pixel. The first electrode 625 may be in an island type and may be patterned for each sub-pixel.

The pixel-defining layer 624 may be an organic layer or an inorganic layer.

The pixel-defining layer 624 may be formed of organic materials, such as polyimide, polyamide, BCB, acrylic resin, phenol resin, or the like, or inorganic materials, such as SiNx.

The pixel-defining layer 624 may be a single layer or multiple layers.

The intermediate layer 626 may be formed on an area of the first electrode 625 in which a portion of the pixel-defining layer 624 is exposed.

The intermediate layer 626 may include an emissive layer.

As another example, the intermediate layer 626 includes the emissive layer and may further include at least one of an HIL, an HTL, an ETL, and an EIL. However, the present invention is not limited thereto, and the intermediate layer 626 may include the emissive layer and may further include various functional layers.

Holes and electrons injected from the first electrode 625 and the second electrode 627 are combined in the emissive layer, and the emissive layer may emit light of desired colors.

The second electrode 627 may be formed on the intermediate layer 626.

The second electrode 627 may function as a cathode. The second electrode 627 includes a transparent electrode or a reflective electrode. For example, when the second electrode 627 is used as a transparent electrode, metals having a low work function, for example, lithium (Li), calcium (Ca), lithium fluoride (LiF)/Ca, LiF/Al, Al, magnesium (Mg), or a combination thereof, may be deposited on the intermediate layer 626, and a transparent conductive layer formed of ITO, IZO, ZnO, $In_2O_3$, etc., may be formed on the above metals or combination thereof. When the second electrode 627 is used as a reflective electrode, the second electrode 627 may be formed of Li, Ca, LiF/Ca, LiF/Al, Al, Mg, and/or a combination thereof.

Unlike the embodiment of FIG. 1, the second electrode 627 of the present embodiment may be a single conductive layer. The second electrode 627 may extend integrally over the emissive area of each sub-pixel and the pixel-defining layer 624.

According to an embodiment, a plurality of sub-pixels may be formed on the display substrate 611, and each of the sub-pixels may emit red light, green light, blue light, or white light. However, the present invention is not limited thereto.

According to an embodiment, the intermediate layer 626 may be commonly formed on the first electrode 625 regardless of locations of the sub-pixels. In this regard, the emissive layer may be formed by vertically stacking layers including emissive materials that emit red, green, and blue light, or combining the emissive materials that emit red, green, and blue light.

According to an embodiment, as long as white light is emitted, a combination of other colors may be possible. A color conversion layer that converts the emitted white light into a color (e.g., a predetermined color), or a color filter may be further provided.

The encapsulation substrate 640 may be formed to protect the OLED from external moisture or oxygen. The encapsulation substrate 640 may include glass having rigidity, polymer resin, or a film having flexibility.

A filler 651 may be formed between the display substrate 611 and the encapsulation substrate 640. The filler 651 fills a space located between the display substrate 611 and the encapsulation substrate 640.

A color filter 652 may be located between the encapsulation substrate 640 and the filler 651. The color filter 652 may be formed in a location corresponding to each sub-pixel. The color filter 652 may be formed of various colors in the location corresponding to each sub-pixel.

A black matrix 653 may be located between neighboring color filters 652. The black matrix 653 may be formed in a location corresponding to a non-emissive area of each sub-pixel.

A color filter electrode 655 may be formed on a surface of the color filter 652. The color filter electrode 655 may be a transparent conductive layer. The color filter electrode 655 may be formed on the surface of the color filter 652 facing the filler 651. The color filter electrode 655 may be formed as a common electrode.

A plurality of scatterers 654 may be formed in the filler 651. The scatterers 654 may be distributed in the filler 651. The scatterers 654 may include a plurality of liquid crystals arranged therein. The liquid crystals of the scatterers 654 may be arranged in the filler 651 at random.

When a driving voltage is applied to the color filter electrode 655, since the scatterers 654 including the liquid crystals are arranged in a direction parallel to an electric field, a refractive index of the filler 651 and a refractive index of the scatterers 654 including the liquid crystals are identical or substantially identical, and thus, a scattering phenomenon does not occur. Accordingly, a defect inspection and a laser repair may be possible.

As described above, according to one or more of the above exemplary embodiments, an organic light-emitting display apparatus may arrange liquid crystals in a specific direction by applying voltages to an electrode formed on one surface of a color filter and a second electrode of an OLED, and thus, no phenomenon occurs. Thus, sub-pixels, TFTs, wirings, etc. may be easily observed, thereby facilitating a defect inspection and a laser repair.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein, without departing from the spirit and scope of the present invention as defined by the following claims, and their equivalents.

What is claimed is:

1. An organic light-emitting display apparatus comprising:
    a display substrate;
    at least one thin film transistor (TFT) on the display substrate;
    an organic light-emitting diode (OLED) electrically connected to the TFT, the OLED comprising:
        a first electrode on each sub-pixel on the display substrate;
        an intermediate layer on the first electrode; and
        a second electrode on the intermediate layer;
    an encapsulation substrate covering the OLED;
    a filler filling a space between the display substrate and the encapsulation substrate, the filler comprising scatterers having optical anisotropy; and
    a color filter between the encapsulation substrate and the filler, the color filter comprising a color filter electrode at a surface of the color filter.

2. The organic light-emitting display apparatus of claim 1, wherein the scatterers are arranged in the filler, and a plurality of liquid crystals are in the scatterers.

3. The organic light-emitting display apparatus of claim 2, wherein the liquid crystals are arranged at random.

4. The organic light-emitting display apparatus of claim 2, wherein a refractive index in a z axial direction of a liquid crystal director is different from a refractive index of an xy plane at right angle to the liquid crystal director, and the refractive index of the xy plane is the same as a refractive index of the filler.

5. The organic light-emitting display apparatus of claim 2, wherein the scatterers have a spherical shape, an ellipsoidal shape, and/or a network shape.

6. The organic light-emitting display apparatus of claim 5, wherein the liquid crystals included in the scatterers comprise cyanobiphenyl-based mixtures, phenylcyclohexane and/or biphenylcyclohexane mixtures, or cyclohexane-fluorinated biphenyls and/or fluorinated terphenyls mixtures.

7. The organic light-emitting display apparatus of claim 2, wherein the filler comprises an ultraviolet curable polymer.

8. The organic light-emitting display apparatus of claim 7, wherein the filler comprises acrylate-based pre-polymer, thiol-ene-based pre-polymer, and/or silicone-based pre-polymer.

9. The organic light-emitting display apparatus of claim 2, wherein the organic light-emitting display apparatus is configured to operate in a non-scattering mode in which the liquid crystals are arranged in a direction parallel to an electric field when voltages are applied to the color filter electrode and the second electrode.

10. The organic light-emitting display apparatus of claim 1, wherein the color filter electrode is on the surface of the color filter facing the filler.

11. The organic light-emitting display apparatus of claim 1, wherein the color filter electrode comprises a transparent electrode.

12. The organic light-emitting display apparatus of claim 1, wherein the color filter electrode comprises a common electrode.

13. The organic light-emitting display apparatus of claim 1, wherein the intermediate layer comprises:
    an emissive layer; and
    at least one pattern layer stacked on at least one surface of the emissive layer.

14. The organic light-emitting display apparatus of claim 13, wherein the at least one pattern layer comprises at least one of a hole injection layer (HIL), a hole transport layer (HTL), an electron transport layer (ETL), or an electron injection layer (EIL).

15. The organic light-emitting display apparatus of claim 13, wherein the emissive layer and the pattern layer are in an emissive area of each sub-pixel.

16. The organic light-emitting display apparatus of claim 13,
    wherein the emissive layer is in an emissive area of each sub-pixel, and
    wherein the pattern layer extends over emissive areas of neighboring sub-pixels.

17. The organic light-emitting display apparatus of claim 1, wherein the second electrode comprises:
    a common electrode on the intermediate layer in an emissive area of each sub-pixel; and
    a connection electrode configured to electrically connect the common electrodes to each other.

18. The organic light-emitting display apparatus of claim 17, wherein the connection electrode integrally extends over emissive areas of neighboring sub-pixels.

19. The organic light-emitting display apparatus of claim 1, wherein the second electrode comprises a transflective metal layer.

20. The organic light-emitting display apparatus of claim 1, wherein the second electrode integrally extends over emissive areas of neighboring sub-pixels.

* * * * *